(12) United States Patent
Park et al.

(10) Patent No.: US 10,418,116 B2
(45) Date of Patent: Sep. 17, 2019

(54) MEMORY DEVICE WITH CONTROL LOGIC CONFIGURED TO GROUP MEMORY BLOCKS, AND DETERMINE DRIVING VOLTAGES TO BE RESPECTIVELY APPLIED TO THE GROUPS TO CONTROL MEMORY OPERATION

(71) Applicant: SK hynix Inc., Gyeonggi-do (KR)

(72) Inventors: Min Sang Park, Chungcheongbuk-do (KR); Myoung Kwan Cho, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 23 days.

(21) Appl. No.: 15/630,667

(22) Filed: Jun. 22, 2017

(65) Prior Publication Data
US 2018/0082752 A1  Mar. 22, 2018

(30) Foreign Application Priority Data
Sep. 22, 2016  (KR) .......................... 10-2016-0121651

(51) Int. Cl.
*G11C 16/34* (2006.01)
*G11C 16/10* (2006.01)
*G11C 16/28* (2006.01)

(52) U.S. Cl.
CPC .......... *G11C 16/3422* (2013.01); *G11C 16/10* (2013.01); *G11C 16/28* (2013.01)

(58) Field of Classification Search
CPC ...... G11C 16/3422; G11C 16/28; G11C 16/10
See application file for complete search history.

(56) References Cited

U.S. PATENT DOCUMENTS

| 8,819,391 | B1* | 8/2014 | Lock ................... | G06F 12/1027 |
| | | | | 711/206 |
| 9,514,827 | B1* | 12/2016 | Nam ...................... | G11C 16/16 |
| 2007/0047315 | A1* | 3/2007 | Aritome ............... | G11C 16/102 |
| | | | | 365/185.18 |
| 2008/0247234 | A1* | 10/2008 | Lee ..................... | G11C 16/0483 |
| | | | | 365/185.13 |
| 2010/0332729 | A1* | 12/2010 | Alrod .................. | G06F 11/1068 |
| | | | | 711/103 |
| 2012/0268996 | A1* | 10/2012 | Park ........................ | G11C 7/02 |
| | | | | 365/185.12 |

(Continued)

FOREIGN PATENT DOCUMENTS

| KR | 1020120109848 | 10/2012 |
| KR | 101516577 | 5/2015 |

OTHER PUBLICATIONS

Jeong et al. ("Lifetime Improvement of NAND Flash-based Storage Systems Using Dynamic Program and Erase Scaling", Seoul National University, Feb. 2014).*

*Primary Examiner* — Alexander Sofocleous
*Assistant Examiner* — Mushfique Siddique
(74) *Attorney, Agent, or Firm* — IP & T Group LLP

(57) ABSTRACT

A semiconductor memory device includes a memory cell array and a control logic. The memory cell array includes a plurality of memory blocks. The control logic groups the memory blocks, determines driving voltages to be respectively applied to the groups, and applies each of the determined driving voltages to memory blocks included in a corresponding group to control the operation of the memory cell array.

14 Claims, 11 Drawing Sheets

(56) References Cited

U.S. PATENT DOCUMENTS

| | | | |
|---|---|---|---|
| 2012/0275257 A1* | 11/2012 | Park | G11C 7/1051 |
| | | | 365/230.03 |
| 2013/0294155 A1* | 11/2013 | Chen | G11C 16/0483 |
| | | | 365/185.02 |
| 2015/0085584 A1* | 3/2015 | Choi | G11C 16/26 |
| | | | 365/185.21 |
| 2015/0117103 A1* | 4/2015 | Rhie | G11C 8/08 |
| | | | 365/185.11 |
| 2015/0255161 A1* | 9/2015 | Lee | G11C 16/16 |
| | | | 365/185.12 |
| 2016/0124641 A1* | 5/2016 | Kim | G06F 3/061 |
| | | | 711/156 |
| 2016/0141042 A1* | 5/2016 | Peterson | G11C 16/26 |
| | | | 365/185.11 |
| 2016/0172047 A1* | 6/2016 | Jeon | G11C 16/0483 |
| | | | 365/185.11 |
| 2016/0172056 A1* | 6/2016 | Huh | G11C 16/349 |
| | | | 714/719 |
| 2016/0267965 A1* | 9/2016 | Kang | G11C 16/10 |
| 2017/0110185 A1* | 4/2017 | Hahn | G11C 11/5628 |

* cited by examiner

|  | PGM start bias | ERS start bias | Vpass/PGM | Vpass/READ |
|---|---|---|---|---|
| Group1 | Vpsb | Vesb−Δesb2 | Vpp−Δpp2 | Vp3−Δpr2 |
| Group2 | Vpsb+Δpsb1 | Vesb−Δesb1 | Vpp−Δpp1 | Vp3−Δpr1 |
| Group3 | Vpsb+Δpsb2 | Vesb | Vpp | Vpr |

MEMORY DEVICE WITH CONTROL LOGIC CONFIGURED TO GROUP MEMORY BLOCKS, AND DETERMINE DRIVING VOLTAGES TO BE RESPECTIVELY APPLIED TO THE GROUPS TO CONTROL MEMORY OPERATION

CROSS-REFERENCE TO RELATED APPLICATION

The present application claims priority under 35 U.S.C. § 119(a) to Korean patent application number 10-2016-0121651, filed on Sep. 22, 2016, the entire disclosure of which is incorporated herein by reference in its entirety.

BACKGROUND

Field of Invention

Various embodiments of the present disclosure relate to an electronic device, and more particularly, to a semiconductor memory device and an operating method thereof.

Description of Related Art

Semiconductor devices, in particular, semiconductor memory devices are classified into volatile memory devices and nonvolatile memory devices.

The nonvolatile memory devices maintain data stored therein even when a power supply is interrupted, although read and write speeds are comparatively low. Therefore, the nonvolatile memory devices are used when there is a need for storing data which must be maintained regardless of the supply of power. Representative examples of nonvolatile memory devices include a ROM (Read Only Memory), an MROM (Mask ROM), a PROM (Programmable ROM), an EPROM (Erasable Programmable ROM), an EEPROM (Electrically Erasable Programmable ROM), a flash memory, a PRAM (Phase change Random Access Memory), an MRAM (Magnetic RAM), an RRAM (Resistive RAM), an FRAM (Ferroelectric RAM), etc. The flash memory is classified into a NOR type memory and a NAND type memory.

Flash memory devices may be classified into a two-dimensional semiconductor device in which strings are horizontally formed on a semiconductor substrate, and a three-dimensional semiconductor device in which strings are vertically formed on a semiconductor substrate. The three-dimensional semiconductor device is a device which is devised to overcome a limitation in the degree of integration of the two-dimensional semiconductor device and includes a plurality of strings which are vertically formed on a semiconductor substrate. Each string includes a drain select transistor, a plurality of memory cells and a source select transistor which are coupled in series between a bit line and a common source line (SL).

SUMMARY

Various embodiments of the present disclosure are directed to a semiconductor memory device capable of preventing a characteristic change according to a position of a memory block to have an improved operation characteristic.

Various embodiments of the present disclosure are directed to an operating method of a semiconductor memory device for preventing a characteristic change according to a position of a memory block for the semiconductor memory device to have an improved operation characteristic.

One embodiment of the present disclosure provides semiconductor memory device including: a memory cell array including a plurality of memory blocks; and a control logic configured to group the memory blocks, determine driving voltages to be respectively applied to the groups, and apply each of the determined driving voltages to memory blocks included in a corresponding group to control the operation of the memory cell array.

The semiconductor memory device may further include a group information storage unit configured to store information about the groups and the driving voltages for the respective groups.

The control logic may group the memory blocks based on physical positions of the memory blocks.

The control logic may group the memory blocks based on an average program time of the memory blocks.

The control logic may group the memory blocks based on an average number of disturb-fail bits of the memory blocks.

The driving voltage applied to each group may include a program start bias, and the control logic may determine the program start bias to be applied to each group and may apply the determined program start bias to memory blocks included in each group to control a program operation of the memory cell array.

When a group is located relatively close to a central portion of the memory cell, the program start bias corresponding to the group may have a smaller value.

The driving voltage applied to each group may include an erasure start bias, and the control logic may determine the erasure start bias applied to each group and may apply the determined erasure start bias to memory blocks included in each group to control an erasure operation of the memory cell array.

When a group is located relatively close to a central portion of the memory cell array, the erasure start bias corresponding to the group may have a smaller value.

The driving voltage applied to each group may include a program pass voltage, and the control logic may determine the program pass voltage applied to each group and may apply the determined program pass voltage to memory blocks included in each group to control a program operation of the memory cell array.

When a group located relatively close to a central portion of the memory cell array, the program pass voltage corresponding to the group may have a smaller value.

The driving voltage applied to each group may include a read pass voltage, and the control logic may determine the read pass voltage applied to each group and may apply the determined read pass voltage to memory blocks included in each group to control a read operation of the memory cell array.

When a group is located relatively dose to a central portion of the memory cell array, the read pass voltage corresponding to the group may have a smaller value.

Another embodiment of the present disclosure provides an operating method for a semiconductor device including a memory cell array of a plurality of memory blocks, including: grouping the memory blocks into two of more groups; determining a plurality of driving voltages to be respectively applied to the groups; and applying each of the determined driving voltages to memory blocks included in a corresponding group to control an operation of the memory cell array.

The grouping the memory blocks into two or more groups comprises: determining a number of groups for grouping the plurality of memory blocks in the memory cell array; and determining memory blocks to be included in each group based on: the determined number of groups.

Each of the plurality of driving voltages may include at least one of a program start bias, an erasure start bias, a program pass voltage, and a read pass voltage.

The determining of the plurality of driving voltages may include: determining a program start bias or an erasure start bias to be applied to each group; and applying the determined program start bias or erasure start bias to memory blocks included in each group to perform a program operation of the memory cell array.

When a group is located relatively closer to a central portion of the memory cell array, the program start bias or the erasure start bias corresponding to the group may have a smaller value.

The determining of the plurality of driving voltages may include: determining a program pass voltage or a read pass voltage to be applied to each group; and applying the determined program pass bias or the read pass voltage to memory blocks included in each group to perform a program operation of the memory cell array.

When a group is located relatively closer to a central portion of the memory cell array, the program pass voltage or the read pass voltage corresponding to the group may have a smaller value.

BRIEF DESCRIPTION OF THE DRAWINGS

Example embodiments will now be described more fully hereinafter with reference to the accompanying drawings however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements or one or more intervening elements may also be present. Like reference numerals refer to like elements throughout.

DETAILED DESCRIPTION

Figure 1:
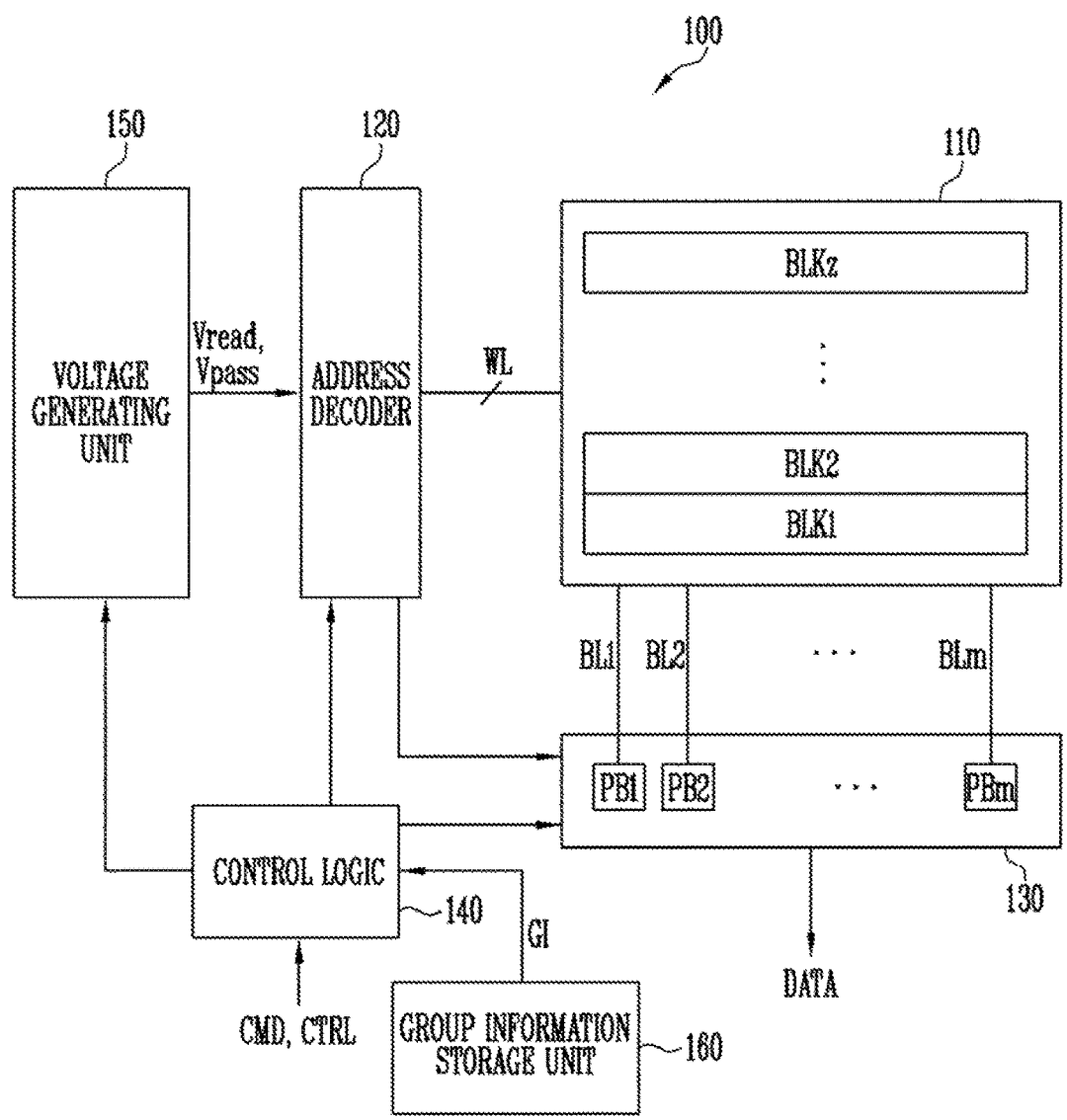
FIG. 1 is a block diagram illustrating a semiconductor memory device according to an embodiment of the present disclosure.

Advantages and features of the present invention, and methods for achieving the same will be described with reference to exemplary embodiments described later in detail together with the accompanying drawings. Accordingly, the present invention is not limited to the following embodiments and may include additional features. Rather, these embodiments are provided so that this disclosure will be thorough, and convey the technical idea of the present disclosure to those skilled in the art.

In addition, if certain parts are described as being "coupled" to other parts, those parts are not only "directly coupled" to the other parts, but also "indirectly coupled" to the other parts with any other device intervened therebetween. In addition, when an element is referred to as "comprising" or "including" a component, it does not preclude another component but may further include the other component unless the context clearly indicates otherwise.

Hereinafter, an exemplary embodiment of the present invention in conjunction with the accompanying drawings will be described in detail. It should be noted that like reference numerals refer to like constituent elements in the drawings. In addition, detailed descriptions of well-known functions or constructions will be omitted since they would obscure the disclosure in unnecessary detail FIG. 1 is a block diagram representing a semiconductor memory device 100 according to an embodiment of the present disclosure.

Referring to FIG. 1, the semiconductor memory device 100 includes a memory cell array 110, an address decoder 120, a read and write circuit 130, a control logic 140 and a voltage generating unit 150.

The memory cell array 110 includes a plurality of memory blocks BLK1 to BLKz. The plurality of memory blocks BLK1 to BLKz is coupled to the address decoder 120 through word lines WL. The plurality of memory blocks BLK1 to BLKz are coupled to the read and write circuit 130 through bit lines BL1 to BLm. Each of the plurality of memory blocks BLK1 to BLKz includes a plurality of memory cells. In an embodiment, the plurality of memory cells are nonvolatile memory cells and may be configured with nonvolatile memory cells respectively having vertical channel structures. The memory cell array 110 may be configured with a memory cell array of a two-dimensional structure. According to an embodiment, the memory cell array 110 may be configured with a memory cell array of a three-dimensional structure. Alternately, each of a plurality of memory cells included in the memory cell array 110 may store at least two-bit data. In an embodiment, each of the plurality of memory cells included in the memory cell array 110 may be a multi-level cell (MLC) for storing the two-bit data. In another embodiment, each of the plurality of memory cells included in the memory cell array 110 may be a triple-level cell for storing three-bit data. In another embodiment, each of the plurality of memory cells included in the memory cell array 110 may be a quad-level cell for storing four-bit data. According an embodiment, the memory cell array 110 may include a plurality of memory cells, each of which stores data of five bits or more.

The address decoder 120, the read and write circuit 140, and the control logic 140 operate as peripheral circuits for driving the memory cell array 110. The address decoder 120 is coupled to the memory cell array 110 through the word lines WL. The address decoder 120 is configured to operate in response to a control of the control logic 140. The address decoder 120 receives an address through an input/output buffer (not illustrated) in the semiconductor memory device 100.

The address decoder 120 is configured to decode a block address among the received addresses. The address decoder 120 selects at least one memory block according to the decoded block address. In addition, the address decoder 120 applies a read voltage Vread generated from the voltage generating unit 150 to a selected word line of the selected memory block at the time of applying a read voltage in the read operation, and applies a pass voltage Vpass to the remaining unselected word lines. In addition, at the time of a program verification operation, the address decoder 120 applies a verification voltage generated in voltage generating unit 150 to a selected word line of the selected memory block and applies the pass voltage to the remaining unselected word lines.

The address decoder 120 is configured to decode a column address among the received addresses. The address decoder 120 transmits the decoded column address to the read and write circuit 130.

A read operation and a program operation of the semiconductor memory device 100 are performed by a page unit. Addresses received at the time of requesting the read and program operations include a block address, a row address, and a column address. The address decoder 120 selects one memory block and one word line according to the block and row addresses. The column address is decoded by the address decoder 120 and is provided to the read and write circuit 130.

The address decoder 120 may include a block decoder, a row decoder, a column decoder, and an address buffer.

The read and write circuit 130 includes a plurality of page buffers PB1 to PBm. The read and write circuit 130 operates as a "read circuit" at the time of a read operation for the memory cell array 110, and as a "write circuit" at the time of a write operation. The plurality of page buffers PB1 to PBm are coupled to the memory cell array 110 through the bit lines BL1 to BLm. The plurality of page buffers PB1 to PBm latch, as sensing data, a change in flowing current amount, which is sensed by a sensing node, according to a program state of a corresponding memory cell, while a sensing current is continuously supplied to the bit lines coupled to the memory cells in order to sense a threshold voltage of the memory cells at the time of a read operation and a program verification operation. The read and write circuit 130 operates in response to page buffer control signals output from the control logic 140.

The read and write circuit 130 senses data in the memory cells at the time of the read operation to temporally store the read data, and then outputs the data DATA to an input/output buffer (not illustrated) of the semiconductor memory device 100. As an exemplary embodiment, the read and write circuit 130 may include a column selection circuit or the like besides page buffers or page registers.

The control logic 140 is coupled to the address decoder 120, the read and write circuit 130, and the voltage generating unit 150. The control logic 140 receives a command CMD and a control signal CTRL through the input/output buffer (not illustrated) of the semiconductor memory device 100. The control logic 140 is configured to control an entire operation of the semiconductor memory device 100 in response to the control signal CTRL. In addition, the control logic 140 outputs a control signal for adjusting a sensing node pre-charge potential level of the plurality of page buffers PB1 to PBm. The control logic 140 may control the read and write circuit 130 to perform a write operation for the memory cell array 110.

The control logic 140 of the semiconductor memory device according to an embodiment of the present disclosure may control operations of the memory cell array 110, the address decoder 120, the read and write circuit 130, and the voltage generating unit 150 such that the memory blocks BLK1 to BLKz in the memory cell array 110 are grouped, driving voltages to be respectively applied to the groups are determined, and the determined driving voltages are applied to memory blocks included in the corresponding group to operate the memory cell array 110. That is, due to the control of the control logic 140, different driving voltages may be applied to each group to operate the memory cell array. According to an embodiment, the operation may include any one of a program operation, an erase operation and a read operation.

The voltage generating unit 150 generates the read voltage Vread and the pass voltage Vpass at the time of the read operation in response to the control signal for the voltage generating unit, which is output from the control logic 140. In particular, the control logic 140 may control the voltage generating unit 150 to generate different operation voltages to be applied to each group.

The semiconductor memory device 100 according to an embodiment of the present disclosure may further include a group information storage unit 160. The group information storage unit 160 may store information about a grouping result of memory blocks and different driving voltages to be applied to memory blocks included in each group. The grouping of the memory blocks BLK1 to BLKz is performed by the control logic 140 and the control logic 140 may store the information about the grouping result of the memory blocks BLK1 to BLKz in the group information storage unit 160. In addition, driving voltages to be applied to the memory blocks BLK1 to BLKz included in each group are determined by the control logic 140 and the control logic 140 may store the information about the determined driving voltages in the group information storage unit 160. The information about the grouping result and the driving voltages may be stored, as group information GI, in the group information storage unit 160.

The group information GI stored in the group information storage unit 160 may be loaded into the control logic 140 at the time of the program operation, erasure operation, or read operation of the semiconductor memory device 100. On the basis of the loaded group information GI, the control logic 140 may control the memory cell array 110, the address decoder 120, the read and write circuit 130, and the voltage generating unit 150 such that different driving voltages are applied to each group. Accordingly, a characteristic change according to a relative position of a memory block may be prevented and thus an operation characteristic of the semiconductor memory device may be improved.

Figure 2:
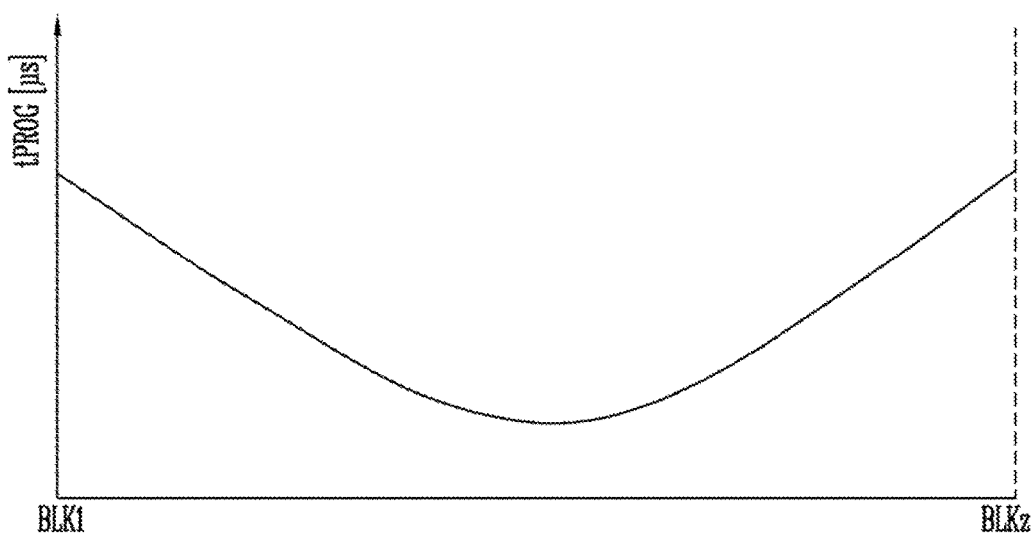
FIG. 2 is a graph representing a program time distribution according to a relative position of a memory block.

FIG. 2 is a graph representing a program time distribution according to a relative position of a memory block. In the graph of FIG. 2, the horizontal axis indicates the relative position of the memory block and the vertical axis indicates a program time tPROG of the memory block. As represented in FIG. 2, memory blocks closer to the memory blocks BLK1 and BLKz, which are positioned at outermost edges, have longer program times and memory blocks positioned closer to the central portion have shorter program times. Since the program time of a memory block positioned at a relatively outer edge is longer, a program speed of the semiconductor memory device is deteriorated.

Furthermore, FIG. 2 illustrates the program time tPROG changing according to the physical position of the memory block, however the program time tPROG may be changed according to various other factors and may be changed by features in process regardless of the memory block position.

Figure 3:
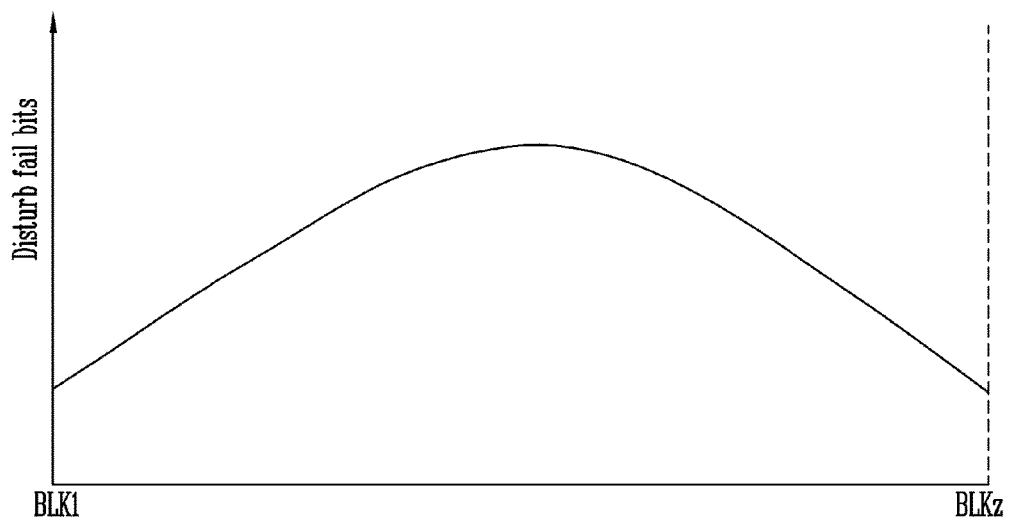
FIG. 3 is a graph representing distribution of the number of disturb-fail bits according to a relative position of a memory block.

FIG. 3 is a graph representing distribution of the number of disturb-fail bits according to a relative position of a memory block. In the graph of FIG. 3, the horizontal axis indicates the relative position of the memory block and the vertical axis indicates the number of disturb-fail bits at the time of read operation of the corresponding memory block. As illustrated in FIG. 3, the memory blocks positioned closer to the central portion have a larger number of disturb-fail bits and the memory blocks closer to the memory blocks BLK1 and BLKz positioned at the outermost edges have a smaller number of disturb-fail bits. Since there are a large number of disturb-fail bits of the memory blocks located relatively closer to the central portion, a read characteristic of the semiconductor memory device is deteriorated.

Furthermore, FIG. 3 illustrates the distribution of the number of disturb-fail bits according to the physical position of the memory block, however the number of disturb-fail bits may be changed according to various other factors and may be changed by features in process regardless of the memory block position.

In the semiconductor memory device according to the present disclosure, memory blocks are grouped according to their relative positions. According to the groups, different driving voltages are applied to memory blocks belonging to the corresponding memory group, and thus a characteristic change according to a relative position of the memory block may be prevented and an operation characteristic of the semiconductor memory device may be improved. The operation characteristic of the semiconductor memory device, which is improved according to an embodiment of the present disclosure, will be described later with reference to FIGS. 4 and 5.

Moreover, as described in relation to FIG. 2, the program time tPROG may be changed regardless of the physical position of the memory block. In the semiconductor memory device according to an embodiment of the present disclosure a program time tPROG for each memory block is measured and memory blocks having similar program times may be grouped according to the measured result. In addition, another characteristic value, for example the number of disturb-fail bits is measured for each memory block and memory blocks having similar numbers of disturb-fail bits may be grouped according to the measured result.

Therefore, a characteristic change according to factors other than the physical position change may also be prevented and thus the operation characteristic of the semiconductor memory device may be improved.

The program time for each memory block or the number of disturb-fail bits is exemplified, but it may be understood that various embodiments, in which various characteristics may be measured for each block and memory blocks having similar values are included in the same group, also fall in the scope of the present disclosure.

Figure 4:
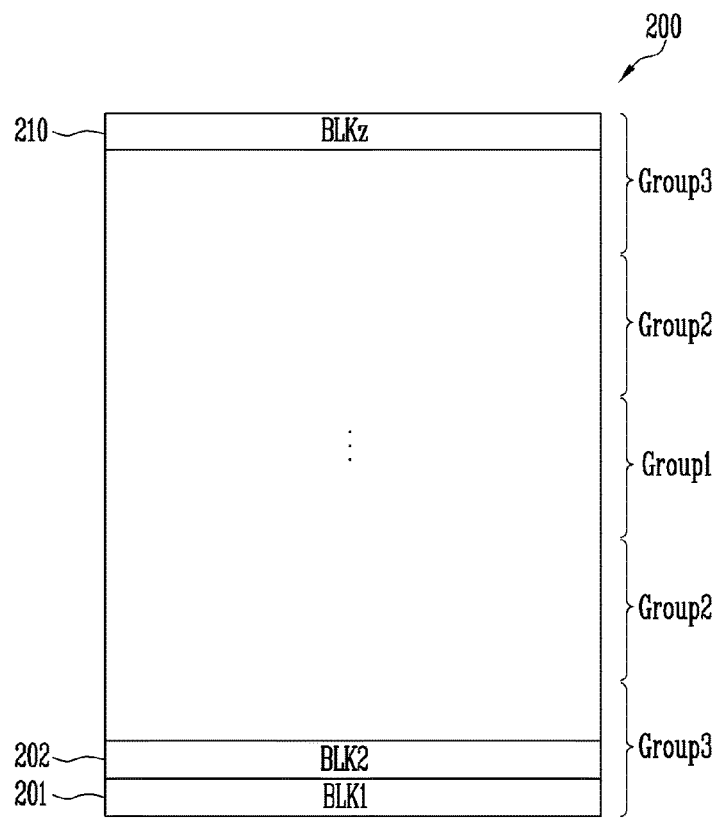
FIG. 4 is a view for describing grouping of memory blocks according to an embodiment of the present disclosure.

FIG. 4 is a view for describing grouping of a memory block according to an embodiment of the present disclosure.

Referring to FIG. 4 the memory cell array 200 including the plurality of memory blocks BLK1 to BLKz is illustrated. The memory blocks BLK1 to BLKz may be sequentially disposed from a first memory block BLK1 to a z-th memory block BLKz. According to an embodiment of the present disclosure, the memory blocks BLK1 to BLKz may be grouped into first to third groups Group1 to Group3. The first group Group1 may include memory blocks positioned at the central portion of the memory cell array 200. The second group Group2 may include memory blocks positioned at sides of the first group Group1. The third group Group3 may include memory blocks positioned at sides of the second group Group2. That is, the first group Group1 includes the memory blocks located relatively closer to the central portion, the third group Group3 may include the memory blocks located relatively closer to edges of the memory cell array 200, and the second group Group2 includes the memory blocks positioned between the first and third groups Group 1 and Group 3.

According to an embodiment of the present disclosure, memory blocks in the memory cell array 200 may be symmetrically grouped. In addition, according to an embodiment of the present disclosure, driving voltages having a different value for each group may be determined. Driving voltages having an identical value may be applied to memory blocks included in the same group. According to an embodiment illustrated in FIG. 4, since the memory blocks BLK1 to BLKz in the memory cell array 200 are grouped into three groups Group1 to Group3, driving voltages having three values may be determined.

In an embodiment, the driving voltage may include a program start bias. In this case, the program start bias having three values may be determined in the embodiment illustrated in FIG. 4. According to an embodiment of the present disclosure, since a group is located relatively closer to the central portion, the program start bias corresponding to the group may have a smaller value. For example, in the embodiment illustrated in FIG. 4, the program start bias applied to the memory blocks included in the second group Group2 may have a greater voltage than that applied to the memory blocks included in the first group Group1. In addition, the program start bias applied to the memory blocks included in the third group Group3 may have a greater voltage value than that applied to the memory blocks included in the second group Group2.

In another embodiment the driving voltage may include an erasure start bias. In this case, the erasure start bias having three values may be determined in the embodiment illustrated in FIG. 4. According to the embodiment of the present disclosure, when a group is located relatively closer to the central portion, the erasure start bias corresponding to the group may have a smaller value. For example, the embodiment illustrated in FIG. 4, the erasure start bias applied to the memory blocks Included in the second group Group2 may have a greater voltage value than that applied to the memory blocks included in the first group Group1. In addition, the program start bias applied to the memory blocks included in the third group Group3 may have a greater value than that applied to the memory blocks included in the second group Group2.

In another embodiment, the driving voltage may include a program pass voltage. In this case, the program pass voltage having three values may be determined in the embodiment illustrated in FIG. 4. According to an embodiment of the present disclosure, when a group is located relatively closer to the central portion, the program pass voltage corresponding to the group may have a smaller value. For example, in the embodiment illustrated in FIG. 4, the program pass voltage applied to the memory blocks included in the second group Group2 may have a greater value than that applied to the memory blocks included in the first group Group1. In addition, the program pass voltage applied to the memory blocks included in the third group Group3 may have a greater value than that applied to the memory blocks included in the second group Group2.

In another embodiment the driving voltage may include a read pass voltage. In this case, the read pass voltage having three values may be determined in the embodiment illustrated in FIG. 4. According to an embodiment of the present disclosure, when a group located relatively closer to the central portion, the read pass voltage corresponding to the group may have a smaller value. For example, in the embodiment illustrated in FIG. 4, the read pass voltage applied to the memory blocks included in the second group Group2 may have a greater voltage value than that applied to the memory blocks included in the first group Group1. In addition, the read pass voltage applied to the memory blocks included in the third group Group3 may have a greater voltage value than that applied to the memory blocks included in the second group Group2.

According to an embodiment of the present disclosure the memory blocks in the memory cell array are grouped into a plurality of groups and a driving voltage is applied to memory blocks included in a group is determined according to a relative position of the group. Therefore, a characteristic change according to the position of the memory block may be prevented to improve an operation characteristic of the semiconductor memory device.

Figure 5:
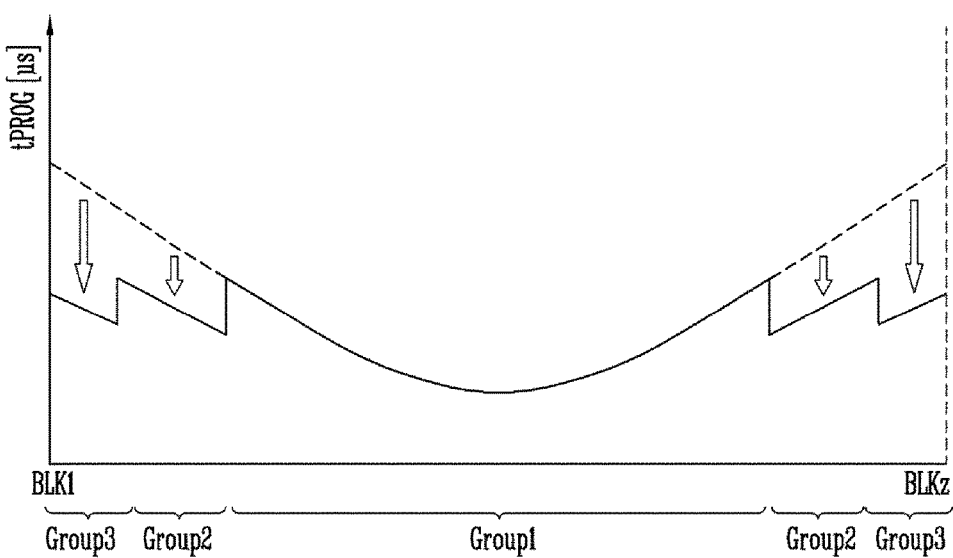
FIG. 5 is a graph representing a program time distribution according to a relative position of a memory block at the time of operation of a semiconductor memory device according to an embodiment of the present disclosure.

FIG. 5 is a graph representing a program time distribution according to a relative position of a memory block at the time of operation of a semiconductor memory device according to an embodiment of the present disclosure. FIG. 5 shows the program time distribution of the memory blocks, which are grouped into three groups Group1 to Group3 as illustrated in FIG. 4.

According to an embodiment of the present disclosure, as described in relation to FIG. 4, when a group is located relatively closer to the central position at the time of a program operation a program start bias having a relatively smaller value is applied to memory blocks belonging to the corresponding group. In addition, when the group is located relatively closer to the central position at the time of the program operation, a program pass voltage having a relatively smaller value is applied to memory blocks belonging to the corresponding group. Accordingly, program speeds for memory cells of memory blocks in the second group Group2 and the third group Group3, which are located relatively closer to peripheral portions and thus have slower program speeds, may be improved. Accordingly, in comparison to the case in which a single program start bias and a program pass voltage are applied (illustrated with a dotted line in FIG. 5), the entire program speed of the semiconductor memory device is improved.

According to FIG. 5, an embodiment is illustrated in which a program start bias having a level which becomes smaller for a group located relatively closer to the central portion. However, the present disclosure is not limited thereto, and the program start bias may be applied to groups of memory blocks in various ways if necessary. For example, according to the characteristics of another memory cell array, the first memory block BLK1 may have a shortest program time and the last memory block BLKz may have a longest program time. The memory blocks BLK1 to BLKz are grouped into a plurality of groups, and the program start bias having the relatively smaller value may be applied to memory blocks of a group located relatively closer to the first memory block BLK1. Therefore, the program start bias having the smallest value may be applied to a group in which the first memory block BLK1 belongs and a program start bias having the greatest value may be applied to a group in which the last memory block BLKz belongs.

Additionally, when a program time becomes smaller as a memory block is located relatively closer to first memory block BLK1, the first memory block BLK1 may have a shortest program time and the last memory block BLKz may have a longest program time. The memory blocks BLK1 to BLKz are grouped into a plurality of groups, and the program pass voltage having the relatively smaller value may be applied to memory blocks of a group located relatively closer to the first memory block. Therefore, the program pass voltage having the smallest value may be applied to a group in which the first memory block BLK1 belongs and a program pass voltage having the greatest value may be applied to a group in which the last memory block BLKz belongs. As such, grouping of memory blocks, the program start bias and the program pass voltage to be applied to memory blocks belonging to each group may be determined in various ways, if necessary.

Figure 6:
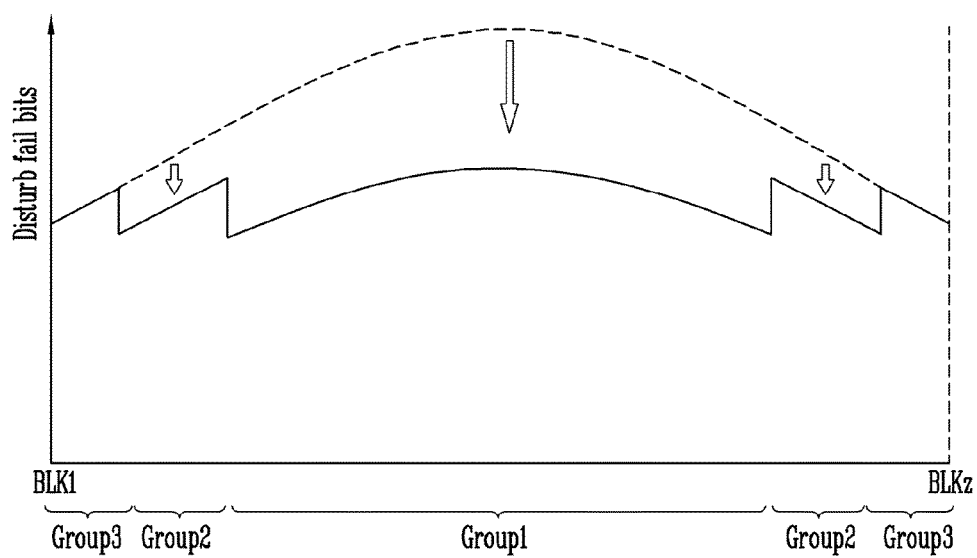
FIG. 6 is a graph representing a distribution of the number of disturb-fail bits according to a relative position of a memory block at the time of operation of a semiconductor memory device according to an embodiment of the present disclosure.

FIG. 6 is a graph representing a distribution of the number of disturb-fail bits according to a relative position of a memory block at the time of operation of a semiconductor memory device according to an embodiment of the present disclosure. FIG. 6 shows the distribution of the number of disturb-fail bits of memory blocks, which are grouped into three groups Group1 to Group3, as illustrated in FIG. 4.

According to the embodiment of the present disclosure, as described in relation to FIG. 4, when a group is located relatively closer to the central position at the time of read operation, a read pass voltage having a relatively smaller value is applied to memory blocks belonging to the corresponding group. Accordingly, the numbers of disturb-fail bits of the first and second groups Group1 and Group 2, which are located relatively closer to the central portion and thus have greater read speeds, may be improved. Accordingly, in comparison to the case in which a single read pass voltage is applied (illustrated with a dotted line in FIG. 6), the entire read speed and reliability of the semiconductor memory device is improved.

According to FIG. 6, the embodiment illustrates a read pass voltage, a level of which becomes smaller for a group located relatively closer to the central portion. However, the present disclosure is not limited thereto, and the read pass voltage may be applied to groups of memory blocks in various ways if necessary. For example, according to the characteristics of another memory cell array, the first memory block BLK1 may have the smallest number of disturb-fail bits and the last memory block BLKz may have the largest number of disturb-fail bits, the memory blocks BLK1 to BLKz are grouped into a plurality of groups, and the read pass voltage having the greater value may be applied to memory blocks of a group located relatively closer to the first memory block BLK1. Therefore, the read pass voltage having the greatest value may be applied to a group in which the first memory block BLK1 belongs, and a read pass voltage having the smallest value may be applied to a group in which the last memory block BLKz belongs. As such, grouping of memory blocks and the read pass voltage to be applied to memory blocks belonging to each group may be determined in various ways, if necessary.

Although not illustrated in FIGS. 5 and 6, according to an embodiment of the present disclosure, when a group is located relatively closer to the central position at the time of an erasure operation, an erasure start bias having a relatively smaller value is applied to memory blocks belonging to the corresponding block. Accordingly, stress on the memory cell according to repetition of the program/erasure operation may be minimized.

Figure 7:
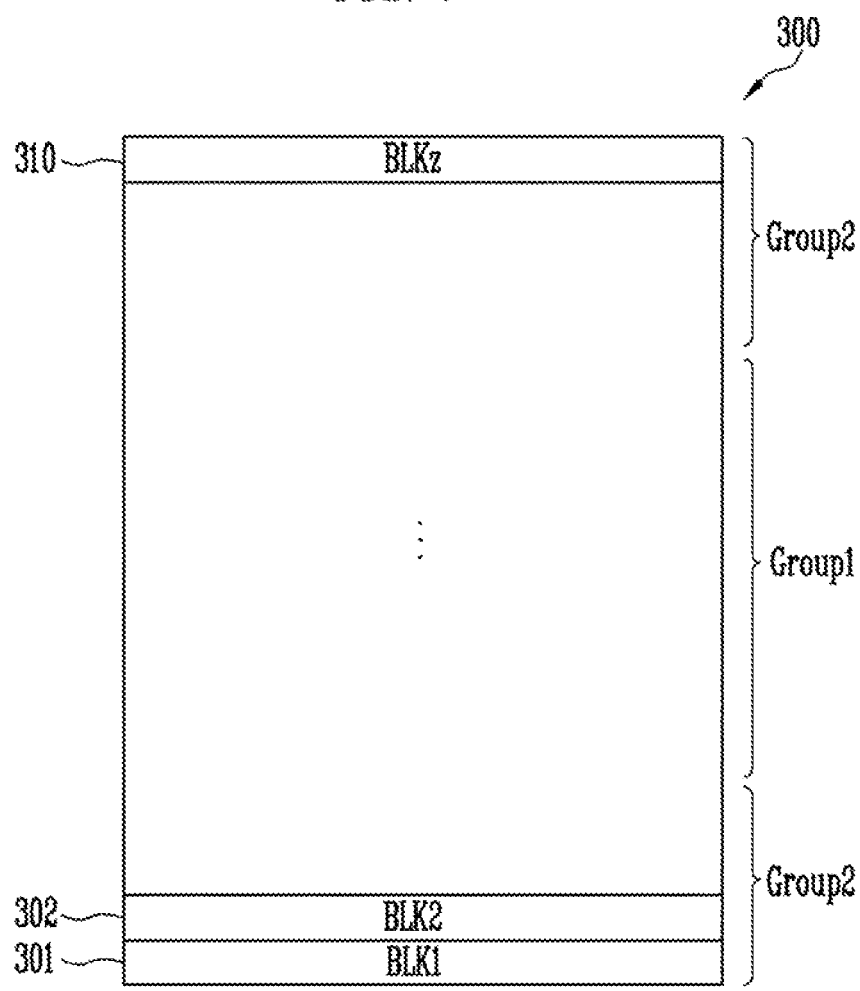
FIG. 7 is a view for describing grouping of memory blocks according to another embodiment of the present disclosure.

FIG. 7 is a view for describing grouping of memory blocks according to another embodiment of the present disclosure.

Referring to FIG. 7, the memory cell array 300 including the plurality of memory blocks BLK1 to BLKz is illustrated. Similar to the view illustrated in FIG. 4, the memory blocks BLK1 to BLKz may be sequentially disposed from the first memory block BLK1 to the z-th memory block BLKz. According to another embodiment of the present disclosure, the memory blocks BLK1 to BLKz may be grouped into first and second groups Group1 and Group2. The first group Group1 may include memory blocks positioned at the central portion of the memory cell array 300. The second group Group2 may include memory blocks positioned at the peripheral portion of the memory cell array 300. That is, the first group Group1 includes the memory blocks located relatively closer to the central portion, and the second group Group2 may include the memory blocks located relatively closer to edges of the memory cell array 300.

Unlike FIG. 4, the memory blocks BLK1 to BLKz of FIG. 7 may be grouped into two groups Group1 and Group2. In this case, the group information storage unit 160 illustrated in FIG. 1 may store data having a small size. In the embodiment of FIG. 7, the memory blocks are grouped into a minimum number of groups to realize the control logic 140 and the group information storage unit 160 in a simple manner in the semiconductor memory device, and operation speeds of corresponding elements may be raised.

Figures 8, 9:
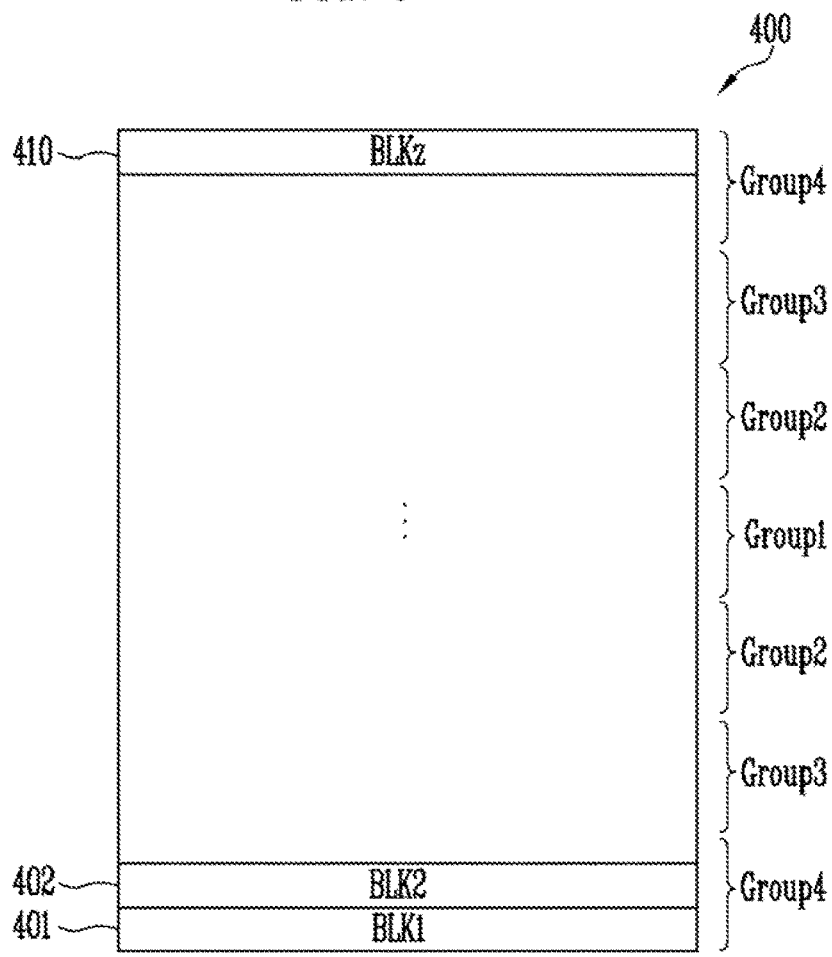
FIG. 8 is a view for describing grouping of memory blocks according to another embodiment of the present disclosure.
FIG. 9 is a table for describing driving voltages according to an embodiment of the present disclosure.

FIG. 8 is a view for describing grouping of memory blocks according to another embodiment of the present disclosure.

Referring to FIG. 8, a memory cell array 400 including the plurality of memory blocks BLK1 to BLKz is illustrated. Similar to the view illustrated in FIG. 4, the memory blocks BLK1 to BLKz may be sequentially disposed from a first memory block BLK1 to a z-th memory block BLKz. According to another embodiment of the present disclosure, the memory blocks BLK1 to BLKz may be grouped Into four groups from first to fourth groups Group 1 to Group 4. The first group Group1 may include memory blocks positioned at the central portion of the memory cell array 400.

The second group Group2 may include memory blocks positioned at sides of the first group Group1. The third group Group3 may include memory blocks positioned at sides of the second group Group2. The fourth group Group4 may include memory blocks positioned at sides of the third group Group3. That is, the first group Group1 includes the memory blocks located relatively closer to the central portion, the fourth group Group4 may include the memory blocks located relatively closer to edges of the memory cell array 400 the second group Group2 includes the memory blocks located relatively closer to the central portion between the first and fourth groups Group1 and Group 4, and the third group Group3 may include the memory blocks located relatively closer to the edges between the first and fourth groups Group1 and Group 4.

Unlike FIG. 4, the memory blocks BLK1 to BLKz of FIG. 8 may be grouped into four groups Group1 to Group4. In this case, large size data is stored in the group information storage unit 160, but a deviation in operation characteristics according to a memory block position may be minimized at the time of driving the semiconductor memory device by subdividing driving voltages to be applied to the plurality of memory blocks BLK1 to BLKz.

FIG. 9 is a table for describing driving voltages according to an embodiment of the present disclosure.

Referring to FIG. 9, an embodiment in which memory blocks in a memory cell array are grouped into three groups Group1 to Group3 is illustrated. The table of FIG. 9 represents a driving voltage applied to each group in the embodiments described in relation to FIGS. 4 to 6.

First, referring to an item of program start bias (denoted as "PGM start bias" in FIG. 9), a PGM start bias value applied to the first group Group1 is Vpsb, a PGM start bias value applied to the second group Group2 is Vpsb+$\Delta$psb1, and a PGM start bias value applied to the third group Group3 is Vpsb+$\Delta$psb2. Here, $\Delta$psb1 and $\Delta$psb2 have positive values and $\Delta$psb2 may have a larger value than $\Delta$psb1. For example, $\Delta$psb2 may have a value of double the value of $\Delta$psb1. Consequently, a PGM start bias value applied to memory blocks in the first group Group1 located relatively closer to the central portion is the smallest, a PGM start bias value applied to memory blocks in the second group Group2 is next larger, and a PGM start bias value applied to memory blocks in the third group Group3 is the largest.

Referring to an item of erasure start bias (denoted as "ERS start bias" in FIG. 9), an ERS start bias value applied to the third group Group3 is Vesb, an ERS start bias value applied to the second group Group2 is Vesb−$\Delta$esb1 and an ERS start bias value applied to the first group Group1 is Vesb−$\Delta$esb2. Here, $\Delta$esb1 and $\Delta$esb2 have positive values and $\Delta$esb2 may have a larger value than $\Delta$esb1. For example, $\Delta$esb2 may have a value of double the value of $\Delta$esb1. Consequently, an ERS start bias value applied to memory blocks in the first group Group1 located relatively closer to the central portion may be the smallest, an ERS start bias value applied to memory blocks in the second group Group2 may be next larger, and an ERS start bias value applied to memory blocks in the third group Group3 may be the largest.

Referring to an item of program pass voltage (denoted as "Vpass/PGM" in FIG. 9), a Vpass/PGM applied to the third group Group3 is Vpp, a Vpass/PGM applied to the second group Group2 is Vpp−$\Delta$pp1, and a Vpass/PGM applied to the first group Group1 is Vpp−$\Delta$pp2. Here, $\Delta$pp1 and $\Delta$pp2 have positive values and $\Delta$pp2 may have a larger value than $\Delta$pp1. For example, $\Delta$pp2 may have a value of double the value of $\Delta$pp1. Consequently, a Vpass/PGM applied to memory blocks in the first group Group1 located relatively closer to the central portion may be the smallest, a Vpass/PGM applied to memory blocks in the second group Group2 may be next larger, and a Vpass/PGM applied to memory blocks in the third group Group3 may be the largest.

Referring to a read pass voltage (denoted as "Vpass/READ" in FIG. 9), a Vpass/READ applied to the third group Group3 is Vp3, a Vpass/READ applied to the second group Group2 is Vp3−Δpr1, and a Vpass/READ applied to the first group Group1 is Vp3−Δpr2. Here, Δpr1 and Δpr2 have positive values and Δpr2 may have a larger value than Δpr1. For example, Δpr2 may have a value of double the value of Δpr1. Consequently, a Vpass/READ applied to memory blocks in the first group Group1 located relatively closer to the central portion may be the smallest, a Vpass/READ applied to memory blocks in the second group Group2 may be next larger, and a Vpass/READ applied to memory blocks in the third group Group3 may be the largest.

Figure 10:
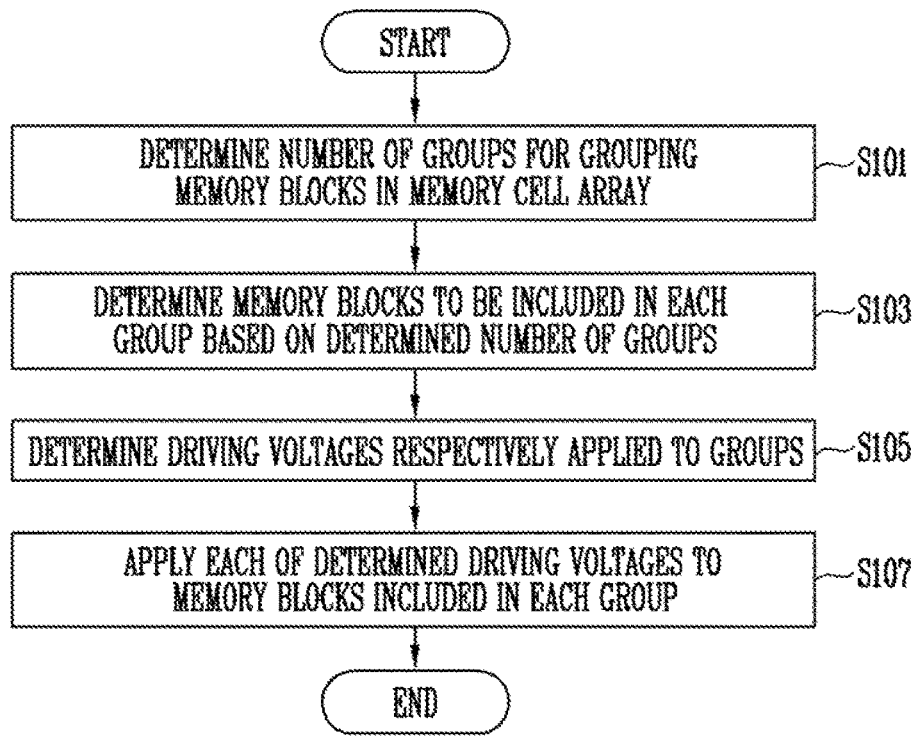
FIG. 10 is a flowchart for describing an operating method of a semiconductor memory device according to an embodiment of the present disclosure.

FIG. 10 is a flow chart for describing an operating method of a semiconductor memory device according to an embodiment of the present disclosure.

Referring to FIG. 10, according to an embodiment of the present disclosure, the number of groups may be determined in order to perform grouping on a plurality of memory blocks included in a memory cell array at step S101, memory blocks to be included in each group may be determined based on the determined number of groups at step S103, a plurality of driving voltages to be respectively applied to the groups may be determined at step S105, and the memory cell array may be operated by applying the determined plurality of driving voltages to memory blocks corresponding to respective corresponding groups at step S107.

In step S101 for determining the number of groups in order to perform grouping on a plurality of memory blocks included in the memory cell array, the number of groups is determined by the control logic 140 for grouping the memory blocks. The number of groups may be adaptively determined in the semiconductor memory device, or be determined by an external host. For example, as described above in relation to FIGS. 4 to 6, the number of groups may be three. In another embodiment, as described in relation to FIG. 7 or 8, the number of groups may be two or four. According to an embodiment of the present disclosure, the number of group is not limited thereto, and may be determined to be 5 or more.

In step S103 for determining the memory blocks to be included in each group on the basis of the determined number of groups, it may be determined which memory block is to be included in each of the determined groups. In an embodiment, as described in relation to FIGS. 4, 7 and 8, according to the physical position of a memory block, the memory blocks may be classified into the determined groups. In another embodiment, regardless of the physical position of the memory block, a characteristic value of a memory block, for example, an average program time tPROG or an average program start bias value of memory cells positioned in each memory block is measured and the memory blocks having similar values may be classified into the same group among the determined groups.

For example, memory blocks having average program times in different ranges may be grouped into different groups. That is, memory blocks having an average program time in a first range are grouped into a first group GROUP1, memory blocks having an average program time in a second range, which is different from the first range, are grouped into a second group GROUP2, and memory blocks having an average value in a third range, which is different from the first and second ranges, are grouped into a third group GROUP3. In this case, regardless of the physical position of each memory block, the memory blocks may be classified into the determined groups according to a unique characteristic of each memory block.

In step S105 for determining a plurality of driving voltages to be respectively applied to the groups, the driving voltages to be respectively applied to the groups may be determined. For example, when the memory blocks are grouped into three groups, as shown in the table of FIG. 9, the driving voltages to be respectively applied to the groups may be determined. The driving voltages may include at least one of a program start bias, an erasure start bias, a program pass voltage and a read pass voltage. According to an embodiment of the present disclosure, when a group is located relatively closer to the central portion, the program start bias corresponding to the group may be determined to have a smaller value. In another embodiment, when the group is located relatively closer to the central portion, the erasure start bias corresponding to the group may be determined to have a smaller value. In another embodiment, when the group is located relatively closer to the central portion, the program pass voltage corresponding to the group may be determined to have a smaller value. In another embodiment, when the group is located relatively closer to the central portion, the read pass voltage corresponding to the group may be determined to have a smaller value.

The grouping result and the driving voltages determined through steps S101 to S105 may be stored in the group information storage unit 160 illustrated in FIG. 1. Then, in step S107, the control logic 140 may control an operation of the memory cell array on the basis of the grouping result and the driving voltages stored in the group information storage unit 160.

Figure 11:
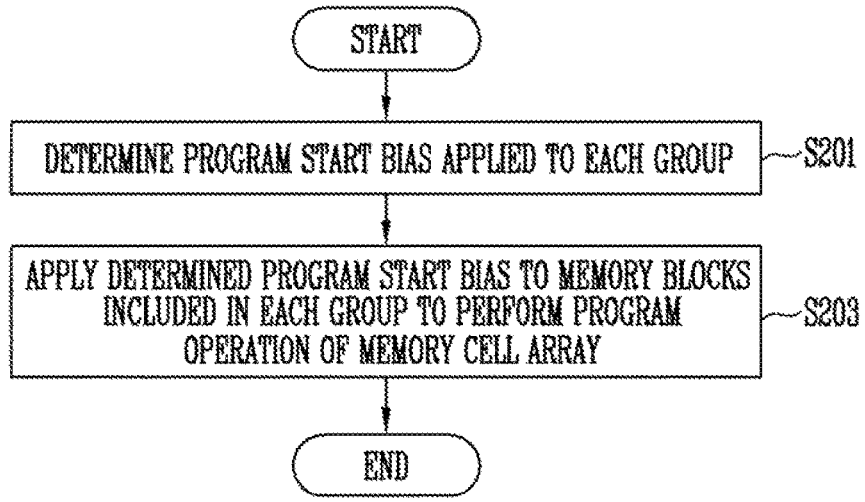
FIG. 11 is a flowchart representing an exemplary embodiment for a driving voltage determining step and a memory cell array operation step illustrated in FIG. 10.

FIG. 11 is a flowchart representing another exemplary embodiment for the driving voltage determining step S105 and the memory cell array operation step S107 illustrated in FIG. 10. Referring to FIGS. 10 and 11 together, the step S105 illustrated in FIG. 10 may include a step S201 for determining, a program start bias to be applied to each group. In addition, the step 107 illustrated in FIG. 10 may include a step S203 for performing a program operation of the memory cell array by applying the determined program start bias to memory blocks included in each group. In step S201, when the group is located relatively closer to the central portion, the program start bias corresponding to the group may be determined to have a smaller value.

Figure 12:
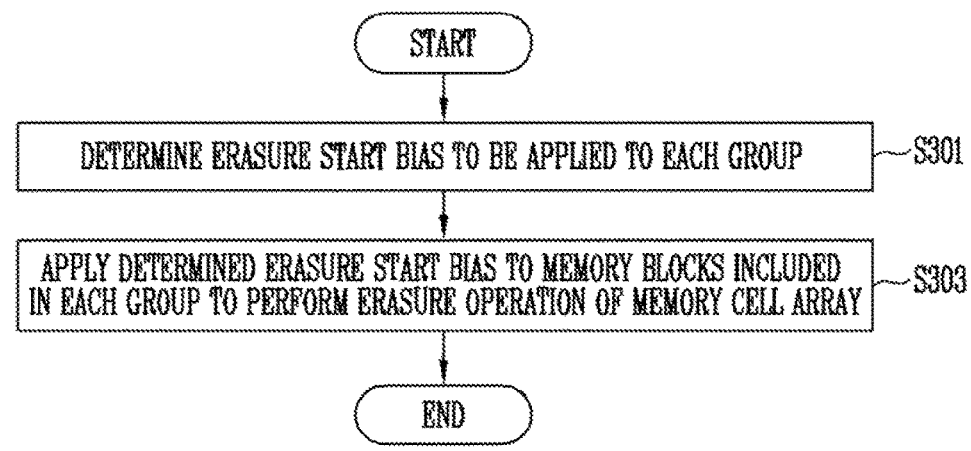
FIG. 12 is a flowchart representing another exemplary embodiment for the driving voltage determining step and the memory cell array operation step illustrated in FIG. 10.

FIG. 12 is a flowchart representing another exemplary embodiment for the driving voltage determining step S105 and the memory cell array operation step S107 illustrated in FIG. 10. Referring to FIGS. 10 and 12 together, the step S105 illustrated in FIG. 10 may include a step S301 for determining an erasure start bias to be applied to each group. In addition, the step 107 illustrated in FIG. 10 may include a step S303 for performing an erasure operation of the memory cell array by applying the determined erasure start bias to memory blocks included in each group. In step S301, when the group is located relatively closer to the central portion, the erasure start bias corresponding to the group may be determined to have a smaller value.

Figure 13:
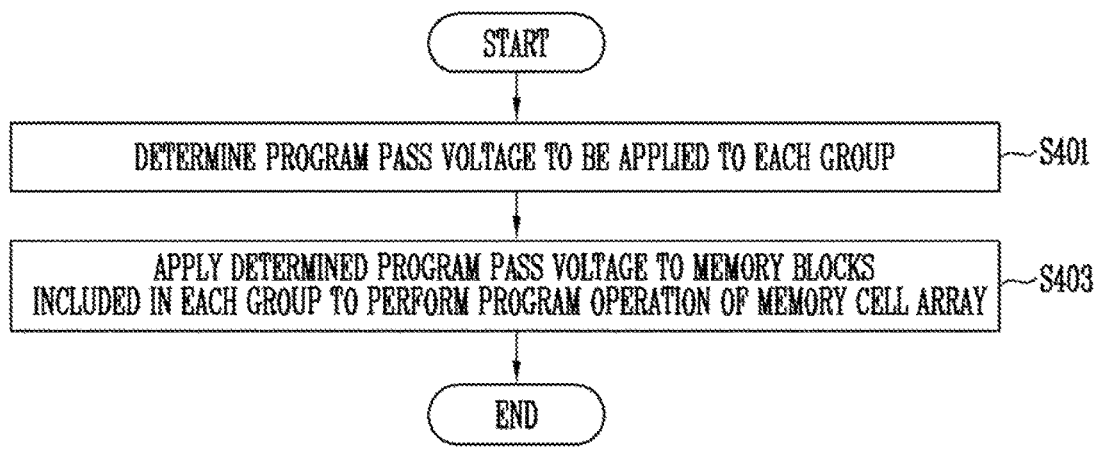
FIG. 13 is a flowchart representing another exemplary embodiment for the driving voltage determining step and the memory cell array operation step illustrated in FIG. 10.

FIG. 13 is a flowchart representing another exemplary embodiment for the driving voltage determining step S105 and the memory cell array operation step S107 illustrated in FIG. 10. Referring to FIGS. 10 and 13 together, the step S105 illustrated in FIG. 10 may include a step S401 for determining a program pass voltage to be applied to each group. In addition, the step 107 illustrated in FIG. 10 may include a step S403 for performing a program operation of the memory cell array by applying the determined program pass voltage to memory blocks included in each group. In step S401, when the group is located relatively closer to the central portion, the program pass voltage corresponding to the group may be determined to have a smaller value.

Figure 14:
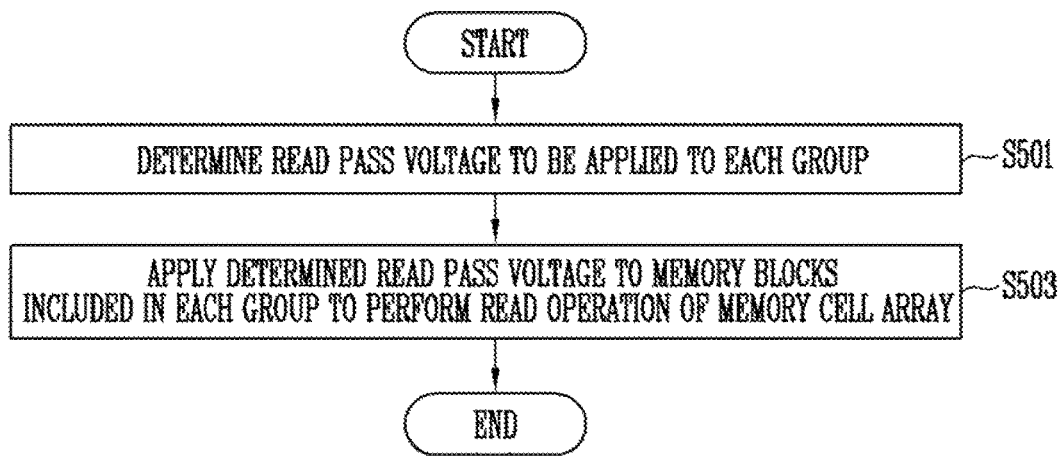
FIG. 14 is a flowchart representing another exemplary embodiment for the driving voltage determining step and the memory cell array operation step illustrated in FIG. 10.

FIG. 14 is a flowchart representing another exemplary embodiment for the driving voltage determining step S105 and the memory cell array operation step S107 illustrated in FIG. 10. Referring to FIGS. 10 and 14 together, the step S105 illustrated in FIG. 10 may include a step S501 for determining a read pass voltage to be applied to each group. In addition, the step 107 illustrated in FIG. 10 may include a step S503 for performing a read operation of the memory cell array by applying the determined read pass voltage to memory blocks included in each group. In step S501, when the group is located relatively closer to the central portion, the read pass voltage corresponding to the group may be determined to have a smaller value.

As described above, the semiconductor memory device and the operating method thereof according to the embodiments of the present disclosure, a characteristic change according to a memory block position is prevented to improve operation characteristics of the semiconductor memory device.

Figure 15:
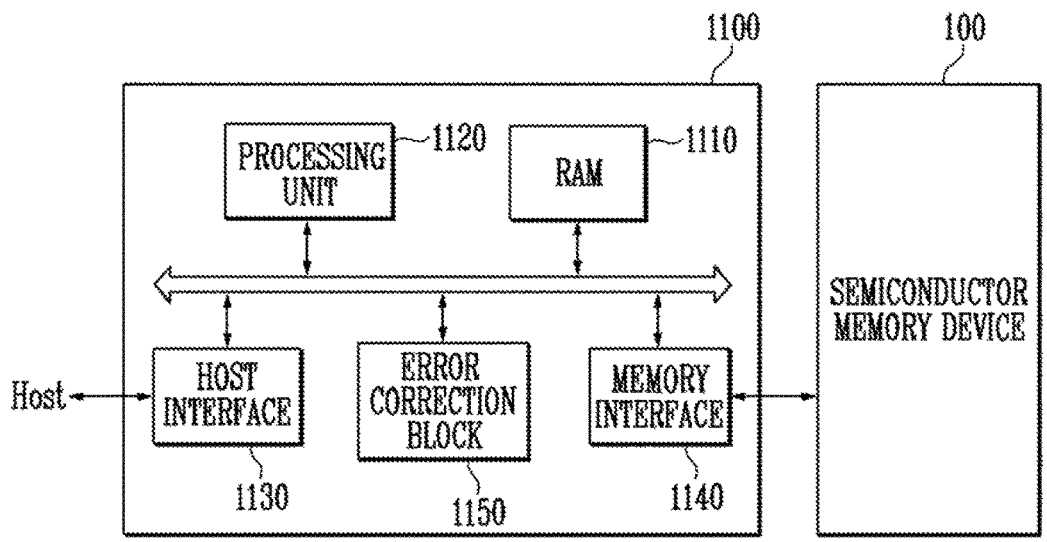
FIG. 15 is a block diagram illustrating a memory system including the semiconductor memory device of FIG. 1.

FIG. 15 is a block diagram illustrating a memory system including the semiconductor memory device of FIG. 1.

Referring to FIG. 15, the memory system 1000 includes the semiconductor memory device 100 and a controller 1100. The semiconductor memory device 100 may have the same configuration and operation as those of the semiconductor memory device described with reference to FIG. 1. Hereinafter, repetitive descriptions will be omitted.

The controller 1100 is coupled to a host Host and the semiconductor memory device 100. The controller 1100 is configured to access the semiconductor memory device 100 in response to a request from the host Host. For example, the controller 1100 is configured to control read, write, erase, and background operations of the semiconductor memory device 100. The controller 1100 is configured to provide an interface between the host Host and the semiconductor memory device 100. The controller 1100 is configured to drive firmware for controlling the semiconductor memory device 100.

The controller 1100 includes a RAM (Random Access Memory) 1110, a processing unit 1120 a host interface 1130, a memory interface 1140, and an error correction block 1150. The RAM 1110 is used as at least one of an operation memory of the processing unit 1120, a cache memory between the semiconductor memory device 100 and the host Host, and a buffer memory between the semiconductor memory device 100 and the host Host. The processing unit 1120 controls the overall operation of the controller 1100. In addition, the controller 1100 may temporarily store program data provided from the host Host during the write operation.

The host interface 1130 includes a protocol for performing data exchange between the host Host and the controller 1100. In an exemplary embodiment, the controller 1100 is configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The memory interface 1140 interfaces with the semiconductor memory device 100. For example, the memory interface includes a NAND interface or NOR interface.

The error correction block 1150 uses an error correcting code (ECC) to detect and correct an error in data received from the semiconductor memory device 100. The processing unit 1120 may adjust the read voltage according to an error detection result from the error correction block 1150, and control the semiconductor memory device 100 to perform re-reading. In an exemplary embodiment, the error correction block may be provided as an element of the controller 1100.

The controller 1100 and the semiconductor memory device 100 may be integrated into a single semiconductor device. In an exemplary embodiment, the controller 1100 and the semiconductor memory device 100 may be integrated into a single semiconductor device to form a memory card. For example, the controller 1100 and the semiconductor memory device 100 may be integrated into a single semiconductor device and form a memory card such as a personal computer memory card international association (PCMCIA), a compact flash card (CF), a smart media card (SM or SMC), a memory stick multimedia card (MMC, RS-MMC, or MMCmicro), a SD card (SD, miniSD, microSD, or SDHC), a universal flash storage (UFS), and the like.

The controller 1100 and the semiconductor memory device 100 may be integrated into a single semiconductor device to form a solid state drive (SSD). The SSD includes a storage device formed to store data in a semiconductor memory. When the memory system 1000 is used as the SSD, an operation speed of the host Host coupled to the memory system 1000 may be phenomenally improved.

In another embodiment, the memory system 1000 may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an exemplary embodiment, the semiconductor memory device 100 or the memory system 1000 may be embedded in various types of packages. For example, the semiconductor memory device 100 or the memory system 2000 may be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP) Small Outline (SOIC) Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), or the like.

Figure 16:
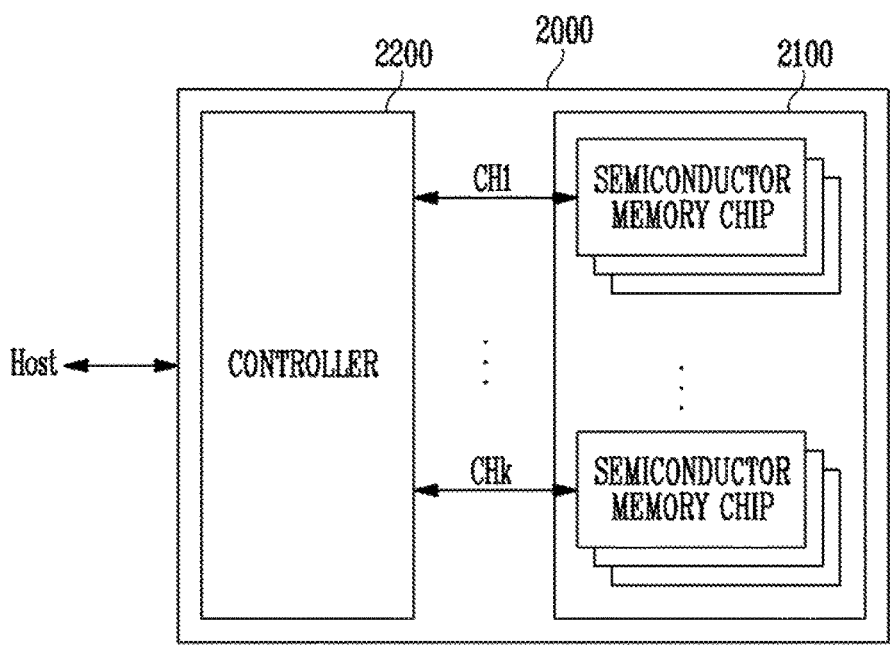
FIG. 16 is a block diagram illustrating an application example of the memory system of FIG. 15.

FIG. 16 is a block diagram illustrating an example of application of the memory system of FIG. 15.

Referring to FIG. 16, the memory system 2000 includes a semiconductor memory device 2100 and a controller 2200. The semiconductor memory device 2100 includes a plurality of memory chips. The semiconductor memory chips are divided into a plurality of groups.

In FIG. 16, it is illustrated that each of the plurality of groups communicates with the controller 2200 through first to k-th channels CH1 to CHk. Each semiconductor memory chip may have the same configuration and operation as those of an embodiment of the semiconductor memory device 100 described with reference to FIG. 1.

Each group communicates with the controller 2200 through one common channel. The controller 2200 has the same configuration as that of the controller 1100 described with reference to FIG. 8 and is configured to control a plurality of memory chips of the semiconductor memory device 2100 through the plurality of channels CH1 to CHk.

Figure 17:
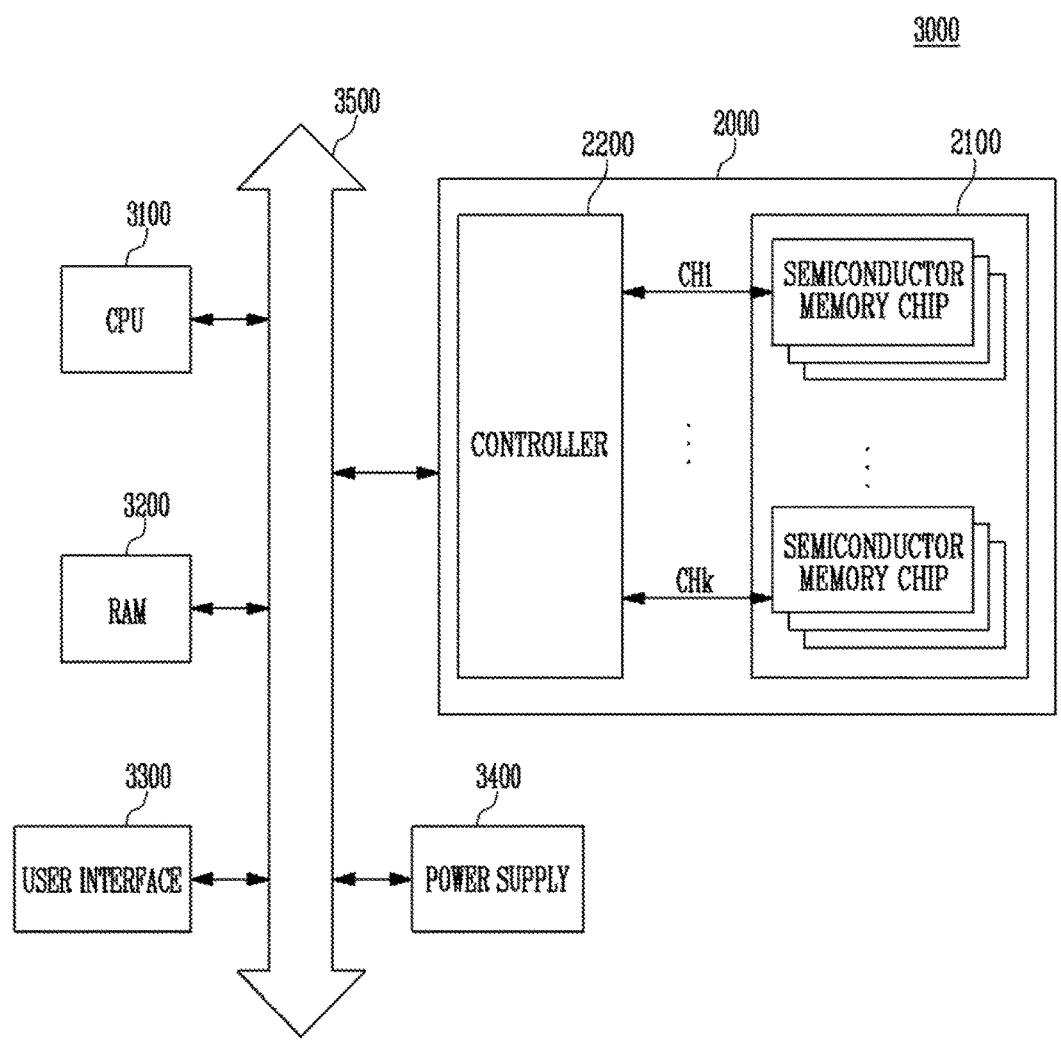
FIG. 17 is a block diagram illustrating a computing system including the memory system explained in relation to FIG. 16.

FIG. 17 is a block diagram illustrating a computing system including the memory system described with reference to FIG. 16.

The computing system 3000 may include a central processing unit 3100, a RAM 3200, a user interface 3300, a power supply 3400, a system bus 3500, and a memory system 2000.

The memory system 2000 is electrically coupled to the CPU 3100, the RAM 3200, the user interface 3300, and the power supply 3400 through the system bus 3500. Data provided through the user interface 3300 or processed by the CPU 3100 is stored in the memory system 2000.

In FIG. 17, the semiconductor memory device 2100 is illustrated as being coupled to the system bus 3500 through the controller 2200. However, the semiconductor memory device 2100 may be directly coupled to the system bus 3500. The function of the controller 2200 may be performed by the CPU 3100 and the RAM 3200.

In FIG. 17, the memory system 2000 described with reference to FIG. 16 is illustrated as being used. However, the memory system 2000 may be replaced with the memory system 1000 described with reference to FIG. 15. In an embodiment, the computing system 3000 may include all of the memory systems 1000 and 2000 described with reference to FIGS. 15 and 16.

According to an embodiment of the present disclosure, a semiconductor memory device may be provided which offsets a characteristic change according to a position of a memory block to have an improved operation characteristic.

According to another embodiment of the present disclosure, an operating method of a semiconductor memory device may be provided which offsets a characteristic change according to a position of a memory block to have an improved operation characteristic.

Example embodiments have been disclosed herein, and although specific terms are employed, the terms are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device comprising:
   a memory cell array including a plurality of memory blocks; and
   a control logic configured to group the memory blocks into a plurality of groups including at least a first group and a second group, determine driving voltages to be respectively applied to the memory blocks included in the first group and the second group, and apply each of the determined driving voltages to memory blocks included in a corresponding group to control an operation of the memory cell array,
   wherein the memory blocks of the first group are located relatively closer to a central portion of the memory cell array than the memory blocks of the second group, and
   wherein the driving voltage corresponding to the first group is determined to have a smaller value than the driving voltage corresponding to the second group,
   wherein the control logic groups the memory blocks based on an average program time of the memory blocks.

2. The semiconductor memory device according to claim 1, further comprising a group information storage unit configured to store information about the groups and the driving voltages for the respective groups.

3. The semiconductor memory device according to claim 1, wherein the control logic groups the memory blocks based on physical positions of the memory blocks.

4. The semiconductor memory device according to claim 1,
   wherein the driving voltages applied to each group comprises a program start bias, and
   wherein the control logic determines the program start bias to be applied to each group and applies the determined program start bias to memory blocks included in each group to control a program operation of the memory cell array.

5. The semiconductor memory device according to claim 1,
   wherein the driving voltages applied to each group comprises an erasure start bias, and
   wherein the control logic determines the erasure start bias applied to each group and applies the determined erasure start bias to memory blocks included in each group to control an erasure operation of the memory cell array.

6. The semiconductor memory device according to claim 1, wherein the driving voltages applied to each group comprises a program pass voltage, and
   the control logic determines the program pass voltage applied to each group and applies the determined program pass voltage to memory blocks included in each group to control a program operation of the memory cell array.

7. The semiconductor memory device according to claim 1,
   wherein the driving voltages applied to each group comprises a read pass voltage, and
   wherein the control logic determines the read pass voltage applied to each group and applies the determined read pass voltage to memory blocks included in each group to control a read operation of the memory cell array.

8. A semiconductor memory device comprising:
   a memory cell array including a plurality of memory blocks; and
   a control logic configured to group the memory blocks into a plurality of groups including at least a first group and a second group, determine driving voltages to be respectively applied to the memory blocks included in the first group and the second group, and apply each of the determined driving voltages to memory blocks included in a corresponding group to control an operation of the memory cell array, wherein the memory blocks of the first group are located relatively closer to a central portion of the memory cell array than the memory blocks of the second group, and wherein the driving voltage corresponding to the first group is determined to have a smaller value than the driving voltage corresponding to the second group, wherein the control logic groups the memory blocks based on an average number of disturb-fail bits of the memory blocks.

9. An operating method for a semiconductor device including a memory cell array of a plurality of memory blocks, the operating method comprising:

grouping the memory blocks into two or more groups, the groups include at least a first group and a second group;

determining a plurality of driving voltages to be respectively applied to the groups, the plurality of driving voltages including at least a first driving voltage corresponding to the first group and a second driving voltage corresponding to the second group; and applying each of the determined driving voltages to memory blocks included in a corresponding group to control an operation of the memory cell array, wherein the memory blocks of the first group are located relatively closer to a central portion of the memory cell array than the memory blocks of the second group, and wherein the first driving voltage is determined to have a smaller value than the second driving voltage, wherein the grouping the memory blocks into two or more groups comprises:

determining a number of groups for grouping the plurality of memory blocks in the memory cell array; and determining memory blocks to be included in each group based on the determined number of groups.

10. The operating method according to claim 9, wherein each of the plurality of driving voltages include at least one of a program start bias, an erasure start bias, a program pass voltage, and a read pass voltage.

11. The operating method according to claim 10, wherein the determining of the plurality of driving voltages comprises:

determining a program start bias or an erasure start bias to be applied to each group; and applying the determined program start bias or erasure start bias to memory blocks included in each group to perform a program operation of the memory cell array.

12. The operating method according to claim 11, wherein when a group is located relatively closer to a central portion of the memory cell array, the program start bias or the erasure start bias corresponding to the group has a smaller value.

13. The operating method according to claim 10, wherein the determining of the plurality of driving voltages comprises:

determining a program pass voltage or a read pass voltage to be applied to each group; and applying the determined program pass bias or the read pass voltage to memory blocks included in each group to perform a program operation of the memory cell array.

14. The operating method according to claim 13, wherein when a group is located relatively closer to a central portion of the memory cell array, the program pass voltage or the read pass voltage corresponding to the group has a smaller value.

* * * * *